(12) United States Patent
Zamprogno (10) Patent No.: US 11,561,237 B2
(45) Date of Patent: *Jan. 24, 2023

(54) CIRCUIT FOR SENSING AN ANALOG SIGNAL, CORRESPONDING ELECTRONIC SYSTEM AND METHOD

(71) Applicant: STMicroelectronics S.r.l., Agrate Brianza (IT)

(72) Inventor: Marco Zamprogno, Cesano Maderno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 17/524,474

(22) Filed: Nov. 11, 2021

(65) Prior Publication Data

US 2022/0065893 A1    Mar. 3, 2022

Related U.S. Application Data

(63) Continuation of application No. 16/738,459, filed on Jan. 9, 2020, now Pat. No. 11,193,952.

(30) Foreign Application Priority Data

Jan. 23, 2019    (IT) .......................... 102019000000989

(51) Int. Cl.
*G01P 15/00*    (2006.01)
*H03M 1/00*    (2006.01)
(Continued)

(52) U.S. Cl.
CPC ........... *G01P 15/123* (2013.01); *H03M 1/001* (2013.01); *G01B 7/18* (2013.01); *G01K 7/18* (2013.01);
(Continued)

(58) Field of Classification Search
CPC .......... G01P 15/123; G01B 7/18; G01K 7/18; G01K 7/26; G01L 9/06; G01R 19/2506;
(Continued)

(56) References Cited

U.S. PATENT DOCUMENTS 6,194,958 B1    2/2001    Goldfarb et al.
6,564,637 B1    5/2003    Schalk et al.
(Continued)

FOREIGN PATENT DOCUMENTS

WO    2009120753 A1    10/2009

*Primary Examiner* — Sophia S Chen
(74) *Attorney, Agent, or Firm* — Slater Matsil, LLP (57) ABSTRACT

A circuit configured to sense an input analog signal generated by a sensor at a first frequency and to generate an output digital signal indicative of the sensed input analog signal. The circuit includes a conditioning circuit, an ADC, a feedback circuit, and a low-pass filter. The conditioning circuit is configured to receive the input analog signal and to generate a conditioned analog signal. The ADC is configured to provide a converted digital signal based on the conditioned analog signal. The feedback circuit includes a bandpass filter configured to selectively detect a periodic signal at a second frequency higher than the first frequency and to act on the conditioning circuit to counter variations of the periodic signal at the second frequency. The low-pass filter is configured to filter out the periodic signal from the converted digital signal to generate the output digital signal.

22 Claims, 5 Drawing Sheets

(51) Int. Cl.
  *G01P 15/12*  (2006.01)
  *G01B 7/16*  (2006.01)
  *G01K 7/18*  (2006.01)
  *G01L 9/06*  (2006.01)
  *G02B 26/08*  (2006.01)
  *G02B 26/10*  (2006.01)
(52) U.S. Cl.
  CPC ............ *G01L 9/06* (2013.01); *G02B 26/0833* (2013.01); *G02B 26/10* (2013.01)
(58) Field of Classification Search
  CPC .. H03M 1/001; H03M 1/0629; H03M 1/0639; H03M 1/124; H03M 1/183; G02B 26/0833; G02B 26/10
  See application file for complete search history.

(56) References Cited

U.S. PATENT DOCUMENTS

| | | | |
|---|---|---|---|
| 11,193,952 B2* | 12/2021 | Zamprogno | .......... H03M 1/183 |
| 2010/0123466 A1 | 5/2010 | Wang et al. | |
| 2010/0145660 A1 | 6/2010 | Lang et al. | |
| 2014/0250971 A1 | 9/2014 | Fang et al. | |
| 2019/0140653 A1 | 5/2019 | Tong et al. | |
| 2020/0295525 A1 | 9/2020 | Maker et al. | |

* cited by examiner

CIRCUIT FOR SENSING AN ANALOG SIGNAL, CORRESPONDING ELECTRONIC SYSTEM AND METHOD

CROSS-REFERENCE TO RELATED APPLICATIONS

This application is a continuation of U.S. application Ser. No. 16/738,459, filed Jan. 9, 2020, which claims priority to Italian Patent Application No. 102019000000989, filed on Jan. 23, 2019, which applications are hereby incorporated herein by reference.

TECHNICAL FIELD

The present disclosure relates generally to an electronic system and method, and, in particular embodiments, to a circuit for sensing an analog signal, corresponding electronic system and method.

BACKGROUND

An analog front-end (AFE) circuit generally includes analog signal conditioning circuits that use sensitive analog amplifiers, e.g., operational amplifiers (op-amps), filters, and sometimes application-specific integrated circuits (ASICs) to provide an electronic functional block which facilitates interfacing a sensor to a subsequent processing stage such as an analog-to-digital converter (ADC), a microcontroller, or the like.

Signal conditioning may be understood as manipulating an analog signal in such a way that, e.g., the signal meets the requirements of the next stage for farther processing, e.g., in terms of maximum input (voltage) range.

In various applications, a sensing stage (e.g., a sensor) may be followed by a signal conditioning stage (possibly involving amplification of the signal received from the sensor) and a processing stage (comprising, e.g., an ADC and/or a microcontroller).

Operational amplifiers are generally employed to perform amplification of the signal in the signal conditioning stage, i.e., in the AFE circuit.

For instance, an AFE circuit may be used for reading out a signal from a piezoresistive sensor associated to a micro-electro-mechanical systems (MEMS) micro-mirror.

According to different applications, micro-mirrors may be driven in:

"linear" mode, wherein the (angular) movement of the micro-mirror follows an approximately linear driving signal such as a ramp signal or and saw-tooth signal; or "resonant" mode, wherein the micro-mirror is driven by a periodic driving signal (e.g., a square wave signal) at a frequency approximately equal to the resonance frequency of the micro-mirror itself.

In resonant mode, the frequency of the driving signal should be kept as close as possible to the resonance frequency of the micro-mirror in order to effectively counter damping effects and sustain vibration of the micro-mirror at its resonance frequency. Additionally, the driving signal should be synchronized with the movement of the micro-mirror, e.g., with the edges of the driving signal corresponding to zero-cross events of a signal generated by a (piezoresistive) sensor coupled to the micro-mirror and configured to sense the position thereof.

Therefore, possible shifts of the resonance frequency of the micro-mirror during operation (e.g., due to temperature and/or pressure variations) should be sensed in order for the driving signal to track the frequency shifts.

Figure 1:
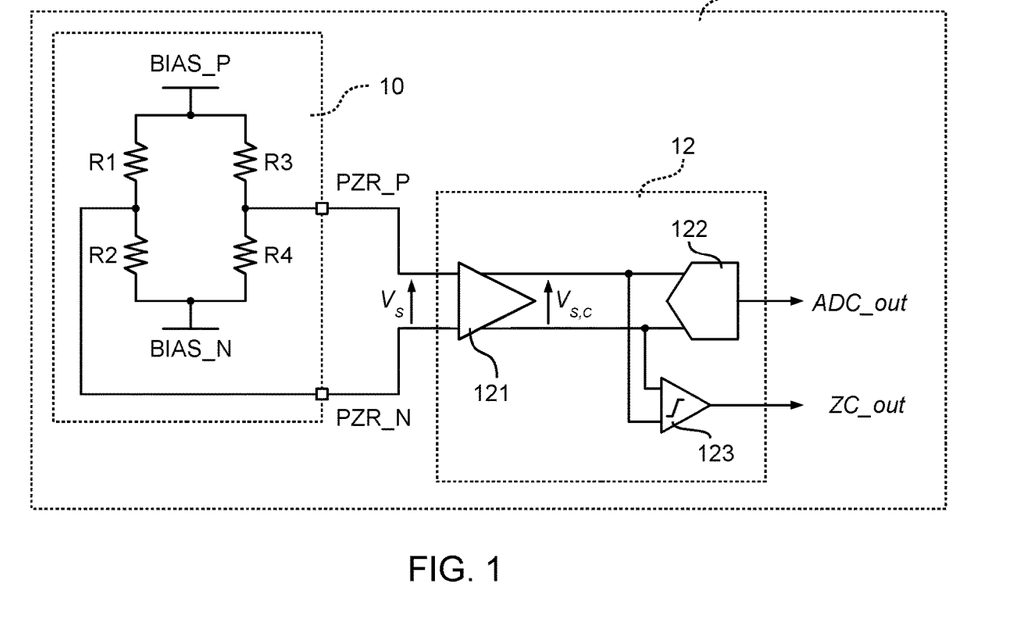
FIG. 1 shows an exemplary piezoresistive sensor and sensing circuit.

As exemplified in FIG. 1, a piezoresistive sensor 10 may be used for sensing mechanical information (e.g., deformation and/or movement) of a micro-mirror associated thereto (not visible in the Figures annexed herein).

In particular, the piezoresistive sensor 10 comprises four piezoresistors R1, R2, R3, and R4 in a full-bridge arrangement. The full-bridge arrangement is biased with a certain supply voltage between a (positive) power supply rail BIAS_P and a (negative) power supply rail BIAS_N. An analog signal $V_S$ can be sensed between the intermediate nodes of the two half-bridges of the piezoresistive sensor 10, i.e., between the node PZR_P (intermediate resistors R3 and R4) and the node PZR_N (intermediate resistors R1 and R2).

As exemplified in FIG. 1, an analog (voltage) signal $V_S$ sensed between the nodes PZR_P and PZR_N is propagated to a sensing circuit 12 comprising an AFE circuit 121 (also referred to as conditioning circuit in the present description) configured for conditioning the analog signal $V_S$ sensed between nodes PZR_P and PZR_N.

The sensing circuit 12 may also comprise an ADC 122 configured for providing an output digital signal ADC_out resulting from conversion to digital of the analog conditioned signal $V_{S,C}$ provided by the AFE circuit 121, and thus indicative of the analog signal $V_S$ provided by the piezoresistive sensor 10.

Alternatively or additionally, the sensing circuit 12 may comprise a comparator circuit 123 (e.g., a comparator with or without hysteresis) coupled at the output of the AFE circuit 121 for generating a zero-cross signal ZC_out indicative of zero-cross events of the analog signal $V_S$ provided by the piezoresistive sensor 10.

In some applications, e.g., when reading out information from resonant micro-mirrors, the piezoresistive sensor 10 may provide a sinusoidal-like analog signal $V_S$ (e.g., due to periodic mechanical movement and/or deformation of the resonant micro-mirror) at a frequency $f_S$ corresponding to the resonance frequency of the micro-mirror. As discussed previously, the resonance frequency of the micro-mirror may change during operation, due to several root-causes related to the micro-mirror itself (e.g., variations of temperature, pressure, etc.). Therefore, a control loop (e.g., a feedback loop sensitive to signal ADC_out, ZC_out or both) may be used in order to keep the micro-mirror moving at a certain (fixed) frequency, irrespective of possible variations of the resonance frequency of the micro-mirror itself, and/or to adapt the frequency of the driving signal to the new (shifted) resonance frequency of the micro-mirror.

Therefore, a change of the resonance frequency of the micro-mirror may be sensed based on the output digital signal ADC_out and/or the zero-cross signal ZC_out. However, the AFE circuit 121 itself may introduce absolute phase shifts and/or phase drifts in the propagated signal $V_{S,C}$ with respect to the input analog signal $V_S$ due to, e.g., temperature variations.

Thus, phase drift of the AFE circuit 121 should be reduced (e.g., kept as low as possible) in order not to impair a correct sensing of the drift of the resonance frequency of the micro-mirror.

Phase drift of the AFE circuit 121 is related to the phase drift of the transfer function $V_{S,C}/V_S$ of the AFE circuit 121.

Figure 2A:
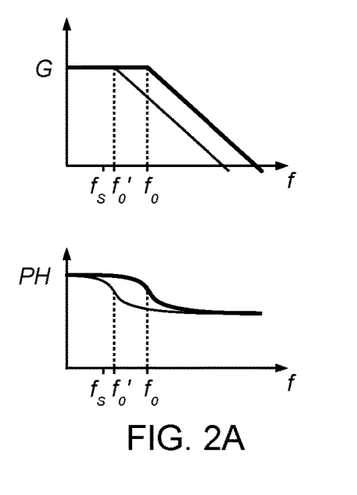
FIG. 2A shows an example of a possible simplified transfer function of the AFE of FIG. 1.

For instance, FIG. 2A is exemplary of a possible simplified transfer function of an AFE circuit 121, in a frequency range of interest for applications involving resonant micromirrors, e.g., from hundreds of Hz to tens of kHz.

In the upper portion of FIG. 2A, the magnitude G of the transfer function $V_{S,C}/V_S$ is reproduced, while in the lower portion of FIG. 2A, the phase PH of the transfer function $V_{S,C}/V_S$ is reproduced.

As exemplified with thick line in FIG. 2A, in the frequency range of interest, a simplified transfer function of an AFE circuit 121 may comprise a single pole at a certain frequency $f_o$, also referred to as the "cut-off frequency" of the AFE circuit 121 in the present description.

Generally, the AFE circuit 121 is designed so that, in normal operating conditions, the frequency $f_o$ is well above the frequency $f_S$ of the analog (sinusoidal-like) signal $V_S$ received at the AFE circuit 121, thereby facilitating conditioning the input analog signal $V_S$ without introducing any relevant phase shift in the output analog conditioned signal $V_{S,C}$. For instance, the frequency $f_o$ may be one decade (i.e., one order of magnitude) higher than the frequency $f_S$ of the analog signal $V_S$, e.g., with $f_S$=300 Hz and $f_o$=3 kHz.

The frequency of poles and zeroes in the transfer function may vary as a result of a change of the operating conditions of the AFE circuit 121, e.g., a change of the operating temperature.

For instance, the thin line in FIG. 2A is exemplary of a case wherein the frequency $f_o$ of the pole is lowered to a new value $f_o'$ (for instance, in the previously considered example wherein $f_o$=3 kHz, $f_o'$ may be around 2.9 kHz). As a result, the new pole frequency $f_o'$ may be closer than the old pole frequency $f_o$ to the frequency $f_S$ of the analog signal $V_S$, so that the phase of the output conditioned signal $V_{S,C}$ of the AFE circuit 121 may be shifted with respect to the phase of the input signal $V_S$, i.e., the output conditioned signal $V_{S,C}$ may exhibit a temperature-dependent shift in the time domain, according to the following equation:

$$\Delta t = \frac{\Delta \varphi}{2\pi f_s}$$

wherein $\Delta\varphi$ is the phase shift introduced by the AFE circuit 121, $f_S$ is the frequency of the input signal $V_S$ and $\Delta t$ is the resulting shift in the time domain of the output conditioned signal $V_{S,C}$.

Figure 2B:
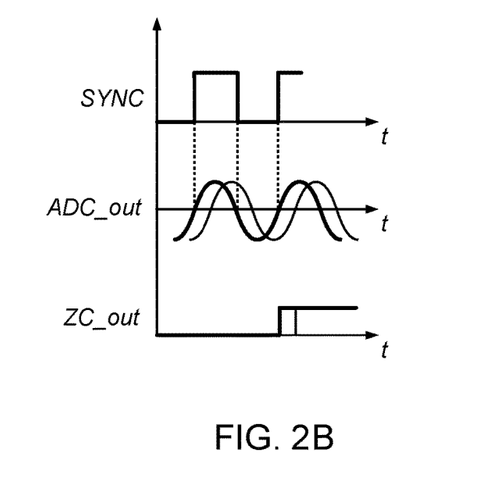
FIG. 2B shows an example of possible waveforms of the sensing circuit of FIG. 1.

For instance, a phase shift $\Delta\varphi$=10 mdeg at a signal frequency $f_S$=400 Hz would result in a time shift $\Delta t$=69 ns of the output conditioned signal $V_{S,C}$, and thus of the output digital signal ADC_out as well as of the zero-cross assertion signal ZC_out, as exemplified in FIG. 2B. In various applications, such time shift $\Delta t$ may not be compliant with the requirements of the control loop.

Generally, two main causes may lead to a shift of the frequency of the poles and/or zeroes of the transfer function of an analog front-end circuit 121.

The first main cause may be a variation of the bandwidth of one or more operational amplifier(s) included in the AFE circuit 121. Known solutions to this issue rely on designing wide-bandwidth operational amplifiers, which however results in higher power consumption and higher design complexity, with corresponding increased silicon area occupation and electronic noise.

The second main cause may be a variation of the gain of the feedback network(s) included in the AFE circuit 121, e.g., due to variations of RC time constants mainly resulting from non-negligible temperature dependence of the resistance values. Known solutions to this issue rely on designing AFE circuits with a switched-capacitor architecture, which has a number of drawbacks, namely:

the need of a continuous-time antialiasing filter at the end of the sensing chain, i.e., between the AFE circuit 121 and the ADC 122, which may still introduce temperature-related phase drifts in the sensing chain, a reduced suitability for the generation of a zero-cross signal ZC_out due to high frequency switching, a correlation between the switching frequency and the mirror resonance frequency, resulting in intermodulation issues, and an increase of silicon area and circuit complexity due to the implementation of a plurality of programmable gain amplifiers in the switched-capacitor architecture, e.g., due to the integrated capacitors not being suitable for the implementation of switched-capacitor architectures.

The piezoresistive sensor 10 may also be provided as an integrated circuit associated to a micro-mirror. Similarly, also the sensing circuit 12 may be provided as an integrated circuit, e.g., an application-specific integrated circuit. The piezoresistive sensor 10 and the sensing circuit 12 may thus be mounted on a common substrate S, e.g., a printed circuit board (PCB), as exemplified in FIG. 1.

Thus, in addition to the undesired phase drift possibly generated by the temperature-dependent behavior of the AFE circuit 121, a second source of possible phase drift of the analog conditioned signal $V_{S,C}$ (and thus, of the output digital signal ADC_out and/or the zero-cross assertion signal ZC_out) is related to the temperature-dependent low-pass filter behavior of the electrical connections on the substrate S between the piezoresistive sensor 10 and the sensing circuit 12.

Figure 3:
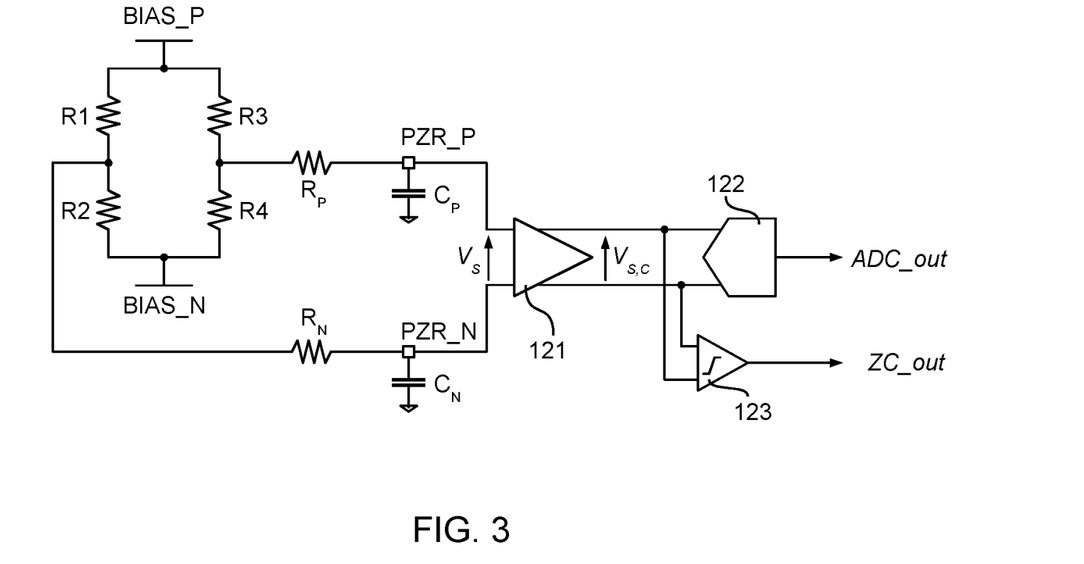
FIG. 3 illustrates the presence of parasitic capacitances in the circuit of FIG. 1.

In particular, parasitic capacitances $C_P$ and $C_N$ coupled to the nodes PZR_P and PZR_N may be present, as exemplified in FIG. 3. Such capacitances may comprise:

a capacitance at the pads of the micro-mirror package, a capacitance due to the electrical connections between the piezoresistive sensor 10 and the sensing circuit 12, implemented e.g., as conductive traces on a PCB, a capacitance at the pads of the package of the sensing circuit 12, and an input capacitance of the AFE circuit 121.

Parasitic capacitances $C_P$ and $C_N$ at the output of the piezoresistive sensor 10 combined with the piezoresistors R1, R2, R3, R4 in the piezoresistive sensor 10 may result in a low-pass filter functionality acting on the analog signal $V_S$ generated by the piezoresistive sensor 10 (also referred to as the PZR output signal in the present description) in a way similar to that previously described with reference to the transfer function of the AFE circuit 121. That is, the cut-off frequency of the low-pass filter may change due to temperature variations (e.g., due to the temperature-dependent behavior of piezoresistors R1, R2, R3, R4), thereby generating additional phase shifts of the analog conditioned signal $V_{S,C}$ (and thus, of the output digital signal ADC_out and/or the zero-cross assertion signal ZC_out).

Known solutions to the above-mentioned issue may rely on inserting respective compensation resistors $R_P$ and $R_N$ between the output nodes of the piezoresistive sensor 10 and the input nodes of the sensing circuit 12 as exemplified in FIG. 3, with the resistors $R_P$ and $R_N$ having a temperature coefficient opposite to the temperature coefficient of the piezoresistors R1, R2, R3, R4.

In particular, the piezoresistors R1, R2, R3, and R4 generally have a positive temperature coefficient (PTC), so that resistors $R_P$ and $R_N$ with a negative temperature coefficient (NTC) may be implemented on the PCB as exemplified in FIG. 3 in order to compensate the drift of the low-pass filter pole due to temperature variations.

However, sizing of the resistors $R_P$ and $R_N$ may be a complex procedure, so that the solution described above allows only rough corrections which are strongly dependent on the specific application, and a residual phase shift—oftentimes unacceptable in case of strict system requirements—is almost always present in the analog conditioned signal $V_{S,C}$.

Another known solution to the issue of temperature-dependent phase drift in AFE circuits relies on complex calibration procedures.

Calibrated AFE circuits may comprise an integrated temperature sensor, e.g., implemented as an ASIC. By calibrating the AFE circuit at two (or more) different temperatures, an interpolation of the relationship between operating temperature and phase drift of the analog conditioned signal $V_{S,C}$ may be inferred, so that during normal operation the output digital signal ADC_out may be corrected in real time based on the temperature sensed by the integrated temperature sensor and the inferred relationship with the phase drift of the analog conditioned signal $V_{S,C}$.

Temperature-calibrated AFE circuits are generally expensive, and the resulting stability of the phase compensation is limited by the precision of the calibration procedure, the accuracy of the interpolation, and other factors. Additionally, temperature-calibrated AFE circuits require digital post-processing of the output digital signal ADC_out which may be often unacceptable in terms of system requirements.

SUMMARY

Despite the extensive activity in the area, further improved solutions are desirable.

Some embodiments relate to a circuit, such as an AFE circuit, e.g., for sensing an analog signal from a sensor.

Some embodiments relate to a corresponding electronic system.

One or more embodiments may relate to a corresponding method of operating such circuit or electronic system.

One or more embodiments may be applied to AFE circuits for sensing signals from PZR sensors. For instance, one or more embodiments may be applied to sensing signals from piezoresistive sensors in MEMS, such as resonant micromirrors.

Some embodiments reduce the input-to-output phase shift of an AFE circuit due to variations of the operating conditions (e.g., temperature variations) thereof, with reduced impact on silicon area and power consumption.

Some embodiments compensate the phase shift due to variations of the operating conditions of the electrical connections between a sensor and a corresponding AFE circuit without the use of additional components (such as NTC resistors) coupled between the sensor and the AFE circuit.

Some embodiments provide phase shift compensation with respect to changes of operating conditions other than temperature, e.g., variations of the supply voltage.

Some embodiments may avoid using temperature calibration for compensation of phase shift.

One or more embodiments relate to a circuit for sensing an input analog signal generated by a sensor at a first frequency and generating an output digital signal indicative of the input analog signal sensed.

In one or more embodiments, the circuit comprises:
a conditioning circuit configured for receiving at an input port the input analog signal and generating at an output port a conditioned analog signal,
an ADC coupled at the output port of the conditioning circuit, the ADC configured for receiving the conditioned analog signal and providing at a converter output node a converted digital signal resulting from conversion to digital of the conditioned analog signal and indicative of the input analog signal sensed,
a feedback circuit between the converter output node of the ADC and a control input of the conditioning circuit, the feedback circuit comprising a band-pass filter configured to selectively detect a periodic signal at a second frequency, the second frequency higher than the first frequency, the feedback circuit being configured to act on the conditioning circuit to counter variations of the periodic signal at the second frequency, and
a low-pass filter coupled at the converter output node of the ADC and having a low-pass cut-off frequency lower than the second frequency, the low-pass filter configured to filter out the periodic signal from the converted digital signal to generate the output digital signal.

In one or more embodiments, the feedback circuit is configured to detect an amplitude of the periodic signal at the second frequency, and:
i) as a result of the amplitude of the periodic signal increasing, acting on the conditioning circuit in order to lower a cut-off frequency of the conditioning circuit; and/or
ii) as a result of the amplitude of the periodic signal decreasing, acting on the conditioning circuit in order to increase a cut-off frequency of the conditioning circuit.

In one or more embodiments, the feedback circuit is configured to detect a phase of the periodic signal at the second frequency, and:
i) as a result of the phase of the periodic signal negatively shifting, acting on the conditioning circuit in order to increase a cut-off frequency of the conditioning circuit; and/or
ii) as a result of the phase of the periodic signal positively shifting, acting on the conditioning circuit in order to lower a cut-off frequency of the conditioning circuit.

In one or more embodiments, the feedback circuit comprises a current-output digital-to-analog converter (DAC) configured to act on the conditioning circuit to counter variations of the periodic signal at the second frequency by varying a bias current of at least one operational amplifier included in the conditioning circuit.

In one or more embodiments, the feedback circuit is configured to act on the conditioning circuit to counter variations of the periodic signal at the second frequency by varying the value of at least one variable resistor and/or at least one variable capacitor included in the conditioning circuit.

In one or more embodiments, the feedback circuit comprises a low-pass digital filter circuit having a low-pass frequency lower than the first frequency and configured to filter out noise from the periodic signal at the second frequency detected.

In one or more embodiments, the circuit further comprises a signal generator circuit configured for superimposing the periodic signal at the second frequency to the input analog signal received at the conditioning circuit.

In one or more embodiments, the signal generator circuit comprises a voltage oscillator and a voltage-to-current converter circuit configured to generate the periodic signal at the second frequency in the form of a square wave current signal.

One or more embodiments may relate to an electronic system comprising:
- a sensor biased with a supply voltage and configured to generate a sensor analog signal at a first frequency,
- a circuit according to one or more embodiments coupled to the sensor for sensing the sensor analog signal at the first frequency and configured for generating an output digital signal indicative of the sensor analog signal sensed, and
- a signal generator circuit configured for generating the periodic signal at the second frequency.

In one or more embodiments the signal generator circuit is coupled to the conditioning circuit in the circuit and is configured to superimpose the periodic signal at the second frequency to the sensor analog signal received at the conditioning circuit.

In one or more embodiments, the signal generator circuit is coupled to the sensor and is configured to superimpose the periodic signal at the second frequency to the supply voltage which biases the sensor.

In one or more embodiments, the signal generator circuit comprises a voltage oscillator and a voltage-to-current converter circuit configured to generate the periodic signal at the second frequency in the form of a square wave current signal.

In one or more embodiments:
- the conditioning circuit comprises a differential input stage comprising a first operational amplifier and a second operational amplifier each having a respective gain resistance, and the input analog signal is received between a first input node of the first operational amplifier and a first input node of the second operational amplifier;
- the signal generator circuit is configured to generate a first periodic signal at the second frequency and a second periodic signal at the second frequency, the second periodic signal being in antiphase with the first periodic signal, by applying a reference voltage to a resistance matched to the gain resistances of the first operational amplifier and the second operational amplifier; and
- the first periodic signal is provided at a second input node of the first operational amplifier, and the second periodic signal is provided at a second input node of the second operational amplifier.

In one or more embodiments, the sensor comprises a piezoresistive sensor coupled to a micro-mirror and configured to detect motion of the micro-mirror.

One or more embodiments, relate to a method of operating a circuit or an electronic system, according to one or more embodiments, the method comprising:
- receiving at the input port of the conditioning circuit an input analog signal generated by a sensor at a first frequency and conditioning the input analog signal to generate at an output port of the conditioning circuit a conditioned analog signal;
- receiving the conditioned analog signal at the ADC coupled at the output port of the conditioning circuit and converting the conditioned analog signal to a converted digital signal indicative of the input analog signal sensed;
- selectively detecting a periodic signal at a second frequency higher than the first frequency at the feedback circuit and acting on the conditioning circuit to counter variations of the periodic signal at the second frequency; and
- filtering out the periodic signal at the second frequency from the converted digital signal to generate the output digital signal.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Throughout the figures annexed herein, like parts or elements are indicated with like references/numerals and a corresponding description will not be repeated for brevity.

The references used herein are provided merely for convenience and hence do not define the extent of protection or the scope of the embodiments.

Figure 4:
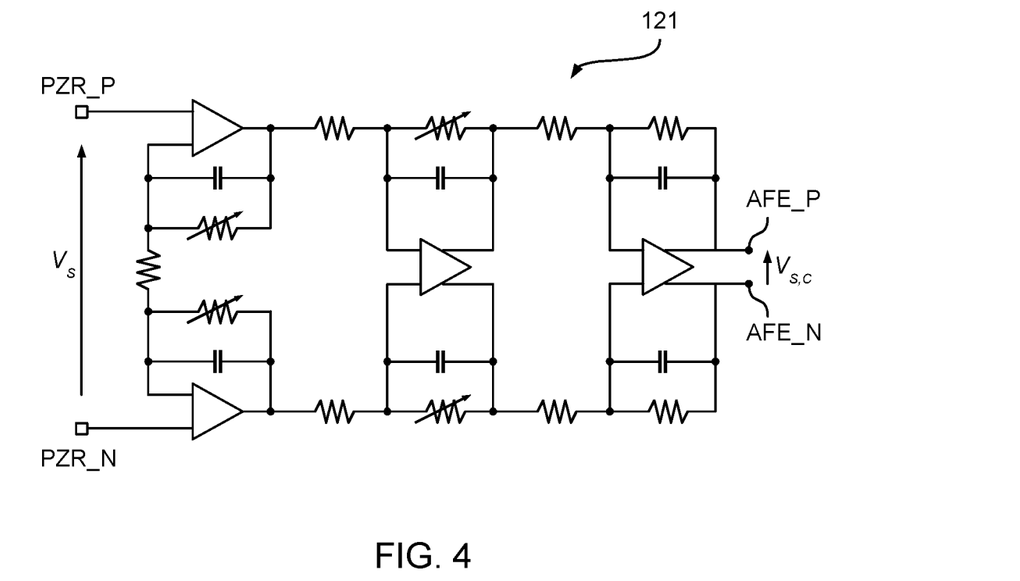
FIG. 4 is a circuit diagram exemplary of a possible architecture of an AFE circuit.

By way of general introduction to the detailed description of exemplary embodiments, reference may be first had to FIG. 4.

FIG. 4 is a circuit diagram exemplary of a possible architecture of an AFE circuit 121, having input nodes PZR_P and PZR_N for coupling to the output of a sensor 10 (e.g., a piezoresistive sensor cooperating with a micro-mirror) and output nodes AFE_P and AFE_N for providing a conditioned replica $V_{S,C}$ of the input signal $V_S$ received from the sensor 10.

In particular, an AFE circuit 121 comprises analog amplifiers such as operational amplifiers which implement a single-stage or multi-stage amplifier circuit. Various stages of the AFE circuit 121 are coupled by using RC networks, optionally tunable (e.g., by using variable resistors, as exemplified in FIG. 4, and/or variable capacitors). The input stage of the AFE circuit 121 may comprise a pair of operational amplifiers, having respective first input nodes coupled to the nodes PZR_P and PZR_N for receiving the input signal $V_S$.

Generally, the frequency behavior of an AFE circuit 121 as exemplified in FIG. 4 may be approximated, in the frequency range of interest for micro-mirror applications, with a single-pole transfer function as already discussed with reference to FIG. 2A. Generally, the frequency $f_o$ of such single pole may be a decade higher than the frequency $f_S$ of the input signal $V_S$ received at nodes PZR_P and PZR_N. For example, $f_o$ may have a value in the range from a few kHz (e.g., 3 kHz) to hundreds of kHz (e.g., 700 kHz).

The transfer function of an AFE circuit 121 may comprise further poles and/or zeroes, which are however typically located at frequencies which are not of interest in the context of the present description.

Figure 5:
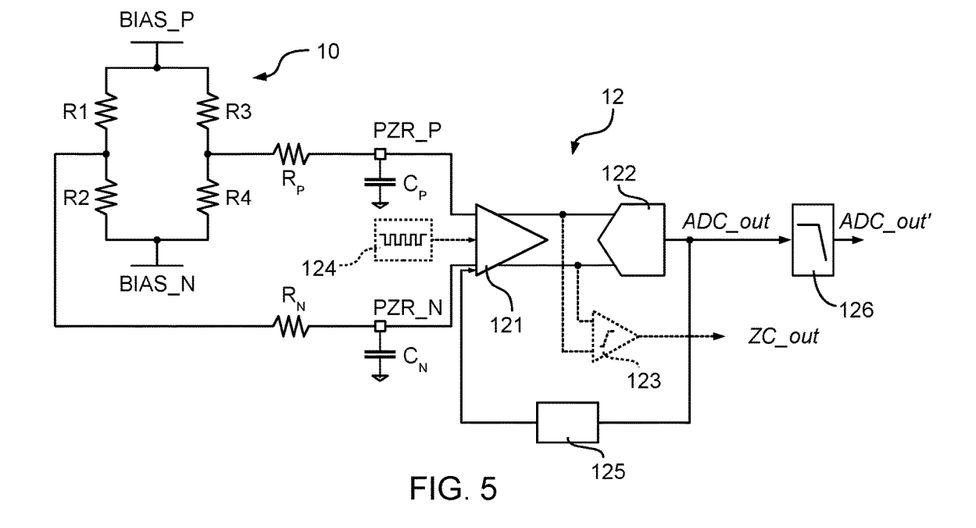
FIG. 5 is a circuit diagram exemplary of embodiments.

According to some embodiments, e.g., and as exemplified in FIG. 5, a circuit 12 for sensing an analog signal $V_S$ generated by a sensor 10 comprises:
- an AFE circuit 121 configured for conditioning an analog input signal $V_S$ sensed between nodes PZR_P and PZR_N, thereby generating an analog conditioned signal $V_{S,C}$;
- an ADC 122 configured for providing a digital output signal ADC_out resulting from conversion to digital of the analog conditioned signal $V_{S,C}$ provided by the AFE circuit 121;
- a feedback circuit 125 coupled between the output node of the ADC 122 and a control input of the AFE circuit 121, the feedback circuit 125 being configured to detect, at the output of the ADC 122, a reference periodic signal at a frequency $f_H$ higher than (or comparable to) the cut-off frequency $f_o$ of the AFE circuit 121 (thus, also higher than the frequency $f_S$: $f_H > f_o > f_S$) propagated through the AFE circuit 121 and the ADC 122, and act on the AFE circuit 121 to counter amplitude and/or phase variations of the reference periodic signal detected; and
- a digital low-pass filter 126 coupled at the output of the ADC 122, the digital low-pass filter 126 having a cut-off frequency $f_{126}$ lower than the cut-off frequency $f_o$ of the AFE circuit 121 and lower than the frequency $f_H$ of the reference periodic signal.

Therefore, the digital low-pass filter 126 is configured to filter the digital output signal ADC_out to provide a further digital output signal ADC_out' at frequency $f_S$ indicative of the analog signal $V_S$ generated by the sensor 10, and not disturbed by the propagation of a signal at frequency $f_H$ through the AFE circuit 121 and the ADC 122.

The frequency $f_H$ is preferably higher than $f_o$ (e.g., $f_H > 2f_o$), e.g., to facilitate filtering out the reference periodic signal at the low-pass filter 126.

However, in some embodiments, operation of a circuit as disclosed herein may be effective provided that the frequency $f_H$ is "comparable" to the cut-off frequency $f_o$, i.e., provided that propagation of a signal at frequency $f_H$ through the AFE circuit 121 is affected (in terms of amplitude and/or phase) by variations (even slight variations) of the cut-off frequency $f_o$. To this regard, frequency $f_H$ may also be lower than the cut-off frequency $f_o$.

In one or more embodiments, the reference periodic signal at frequency $f_H$ is superimposed to the input signal $V_S$ received at nodes PZR_P and PZR_N of the AFE circuit 121.

In a circuit arrangement as described above and illustrated in FIG. 6, the reference periodic signal at frequency $f_H$ (e.g., a square wave signal) propagates through the AFE circuit 121 to the output nodes AFE_P and AFE_N, and thus through the ADC circuit 122, in a way analogous to that of the input analog signal $V_S$ received at nodes PZR_P and PZR_N from the sensor 10 (also referred to as the "effective input signal" in the present description).

Figure 6:
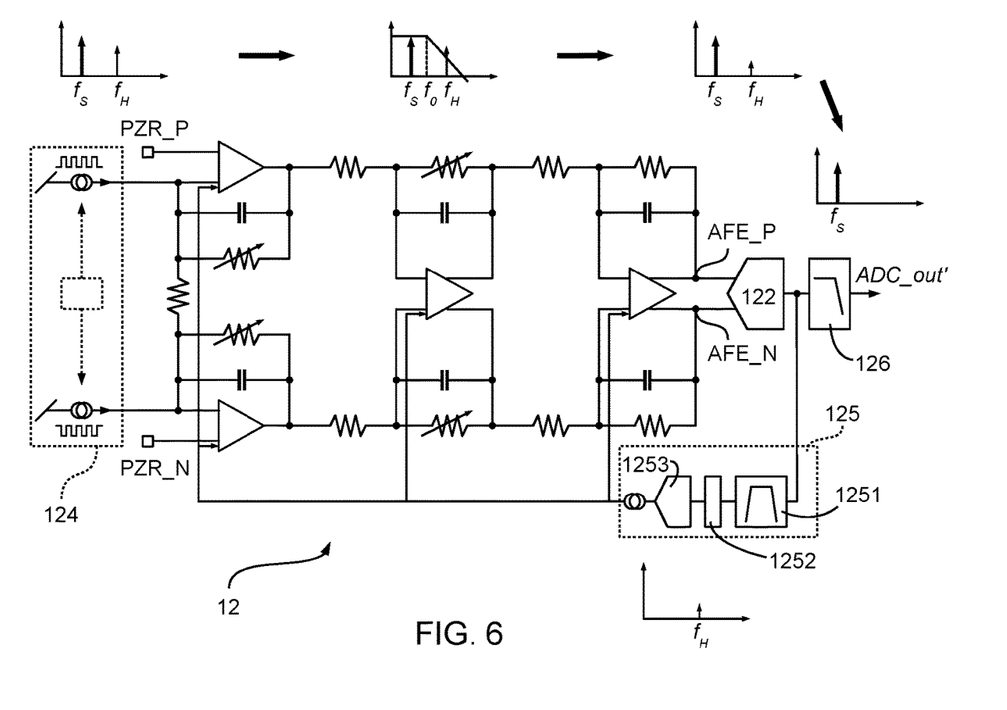
FIG. 6 is exemplary of implementation details of the embodiments of FIG. 5.

As a result of the frequency $f_H$ being higher than the frequency $f_S$ and higher than (or comparable to) the cut-off frequency $f_o$, propagation (in terms of amplitude and/or phase) of the reference periodic signal at frequency $f_H$ is affected (also) by slight variations of the cut-off frequency $f_o$ (e.g., due to temperature variations).

For instance, as a result of the cut-off frequency $f_o$ (slightly) decreasing, the amplitude of the reference periodic signal propagated at the output of the ADC circuit 122 may decrease (i.e., attenuation may take place) and the phase may negatively shift.

Conversely, as a result of the cut-off frequency $f_o$ (slightly) increasing, the amplitude of the reference periodic signal propagated may increase (i.e., amplification may take place) and the phase may positively shift.

Therefore, sensing amplitude and/or phase variations of the reference periodic signal at frequency $f_H$ may facilitate acting on the AFE circuit 121 in order to compensate (even slight) variations of the cut-off frequency $f_o$, with the aim of letting the effective input signal $V_S$ at frequency $f_S$ propagate unaffected.

The feedback circuit 125 is configured to filter the output digital signal ADC_out sensed at the output of the ADC 122 with a band-pass filter 1251 centered around the frequency $f_H$ of the reference periodic signal (i.e., $f_{1251} \approx f_H$).

The feedback circuit 125 may thus be configured to measure the amplitude of such filtered signal at the frequency $f_H$, e.g., measuring the amplitude of the 1st harmonic, and to drive a current-output digital-to-analog converter (DAC) 1253 in order to vary the bias current of at least one operational amplifier in the AFE circuit 121 so as to counter (any) variation of the amplitude of the filtered signal, with this operation also resulting in countering (any) variation (or shift) of the frequency $f_o$ of the main pole of the AFE circuit 121.

Alternatively or additionally, in some embodiments, the feedback circuit 125 may be configured to measure the phase of such filtered signal at the frequency $f_H$ and to drive the current-output DAC converter 1253 in order to vary the bias current of at least one operational amplifier in the AFE circuit 121 so as to counter (any) variation of the phase of the filtered signal, with this operation also resulting in countering any variation (or shift) of the frequency $f_o$ of the main pole of the AFE circuit 121.

Alternatively or additionally, the feedback circuit 125 may be configured to operate on parameter(s) of at least one operational amplifier in the AFE circuit 121 other than the bias current, in order to counter (any) variation (be it an amplitude variation or a phase variation) of the filtered signal at the frequency $f_H$.

Alternatively or additionally, in some embodiments, the feedback circuit 125 may be configured to operate on other parameters of the AFE circuit 121, even not related to the operational amplifiers included therein (e.g., values of resistors and/or capacitors).

Therefore, the feedback circuit 125 implements a sort of control loop operating in parallel with the normal behavior of the AFE circuit 121, in order to (indirectly) measure the sign and magnitude of the phase shift of the AFE circuit 121 (e.g., due to temperature variations) and consequently adjust the biasing and/or other parameters of the AFE circuit 121 to compensate such phase shift.

As described, such measuring the sign and magnitude of the phase shift of the AFE circuit 121 may be performed by:
- directly measuring the phase shift of the reference periodic signal propagated through the AFE circuit 121 and the ADC circuit 122, and/or
- measuring the amplitude variation of the reference periodic signal propagated through the AFE circuit 121 and the ADC circuit 122, and correlating such amplitude variation to a corresponding phase shift.

In the above exemplified embodiments, the feedback circuit 125 takes as digital input the signal ADC_out and operates through discrete steps in order to keep constant the amplitude and/or the phase of the propagated reference periodic signal, thereby facilitating keeping constant the cut-off frequency $f_o$ of the main pole of the transfer function of the AFE circuit 121.

The width of such discrete steps should be lower than the maximum phase shift that can be tolerated in the specific application, and the number of available steps should be related to the range of the phase shift for which compensation is sought.

Optionally, in some embodiments, additional digital filtering may be implemented in the feedback circuit 125 by a digital filter circuit 1252 between the band-pass filter 1251 and the current-output DAC converter 1253, e.g., to filter out noise and provide a low-frequency feedback behavior of the feedback circuit 125. The amplitude of the signal at the frequency $f_H$ filtered by the band-pass filter 1251 may be quite low and possibly may have a low signal-to-noise ratio (SNR), so that low-pass digital filtering at the filter circuit 1252 may facilitate detecting slow variations of the feedback signal (e.g., over a time scale comparable with the typical time scale of temperature variations) and thus provide an improved dynamic range of the measured feedback signal.

Therefore, in some embodiments, additional digital filtering performed at the digital filter circuit 1252 may be advantageous in providing a low-frequency compensation signal (e.g., a current compensation signal with frequency lower than $f_S$) to improve stability of the system.

In one or more embodiments, the circuit 12 may comprise a signal generator circuit 124, configured to generate the reference periodic signal at the frequency $f_H$ and providing such reference periodic signal to the AFE circuit 121 so to be superimposed to the analog input signal $V_S$.

In particular, as exemplified in FIG. 6, the signal generator circuit 124 is configured for generating a reference periodic signal such as a square wave signal, a sinusoidal signal, or others.

For instance, the signal generator circuit 124 may comprise a voltage oscillator and a voltage-to-current (V2I) circuit in order to generate a square-wave reference current signal. In some embodiments, generating the reference periodic signal(s) by using a voltage oscillator and a voltage-to-current circuit may facilitate reducing the dependency on the gain resistance of the AFE circuit 121.

As exemplified in FIG. 6, the reference periodic signal(s) may be input as current signal(s) at the inverting inputs of the operational amplifiers in the first stage of the AFE circuit 121. Such current signals result in an equivalent input voltage having a value which depends on the current magnitude and on the gain resistance of the first stage of the AFE circuit 121, and which is further amplified in the following stages of the AFE circuit 121. The reference periodic current signals may be generated by applying a precise and temperature-independent reference voltage (e.g., a bandgap reference) to a resistance of the same technological type as the gain resistance and matched thereto, so that the magnitude of the equivalent input voltage may not depend on the value of the reference periodic current signal(s) or the value of the gain resistance. In some embodiments, the magnitude of the equivalent input voltage may depend (almost) only on the value of the reference voltage, so to be in turn almost temperature-independent.

Optionally, in some embodiments, the signal generator circuit 124 may generate a pair of reference periodic signals, e.g., square-wave current signals, with the second signal in the pair being anti-phased with respect to the first signal in the pair.

The first signal in the pair of reference periodic signals may be provided at a second input of the first operational amplifier of the input stage of the AFE circuit 121 (with the first input of the first operational amplifier configured for coupling to node PZR_P), and the second signal in the pair of reference periodic signals may be provided at a second input of the second operational amplifier of the input stage of the AFE circuit 121 (with the first input of the second operational amplifier configured for coupling to node PZR_N).

It will be understood that providing a pair of anti-phased reference periodic signals as exemplified in FIG. 6 may be advantageous in the context of a fully-differential architecture as illustrated. However, in one or more embodiments a single reference periodic signal may be provided to the AFE circuit 121.

Figure 7:
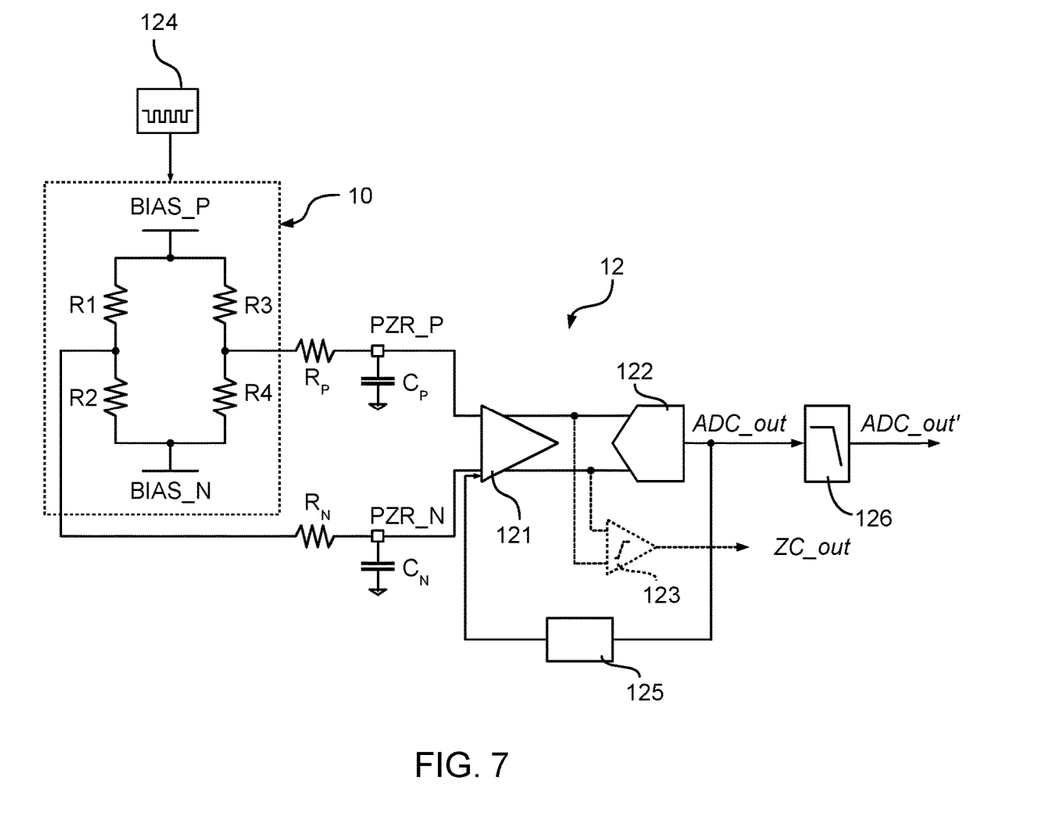
FIG. 7 is a circuit diagram exemplary of further embodiments.

According to one or more embodiments, e.g., and as exemplified in FIG. 7, the signal generator circuit 124 may be configured for providing the reference periodic signal at a frequency $f_H$ to the sensor 10 instead of the AFE circuit 121.

In the embodiments of FIG. 7, the reference periodic signal is superimposed to the "effective input signal" $V_S$ generated by the sensor 10 directly at the sensor 10.

Figure 8:
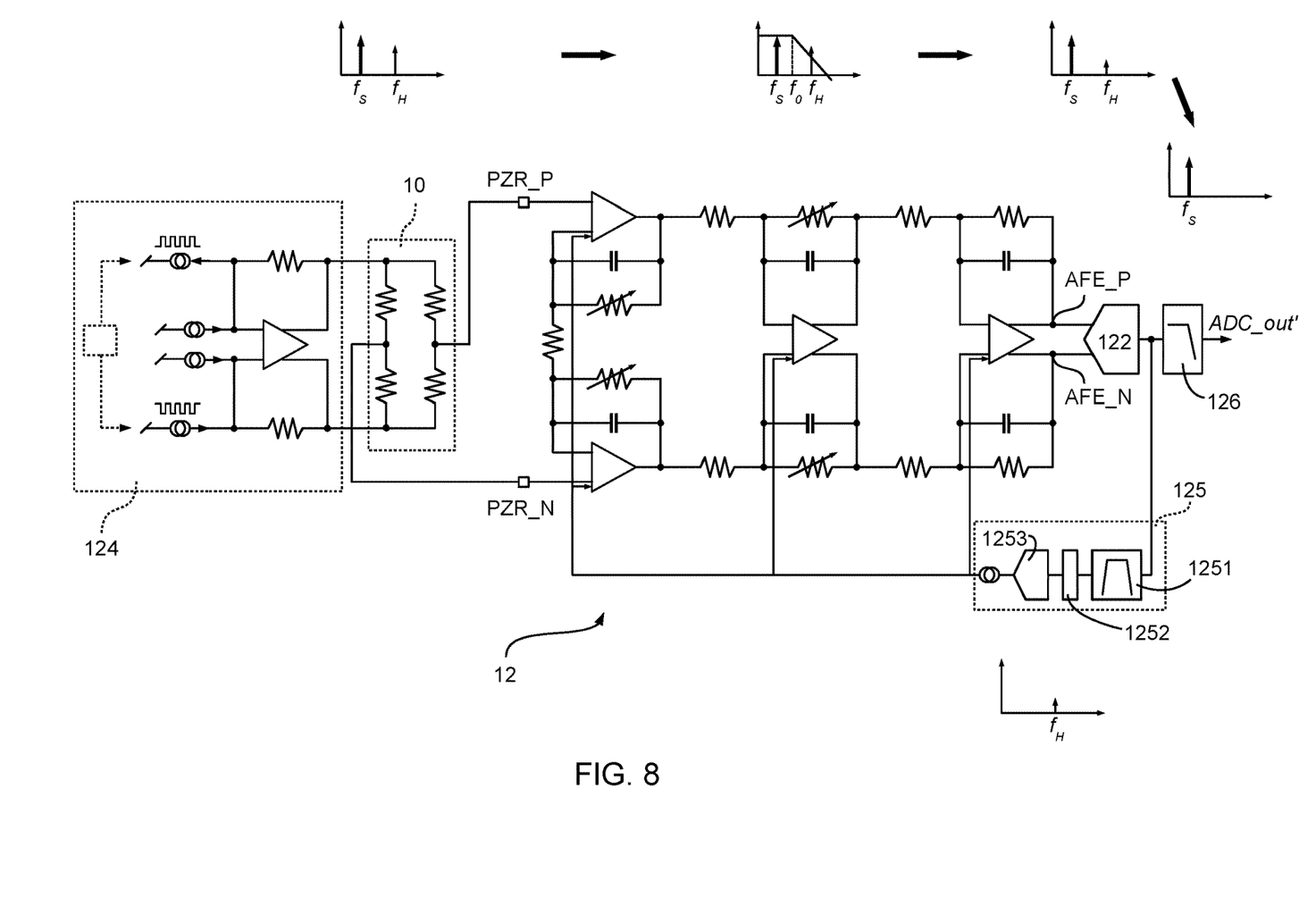
FIG. 8 is exemplary of implementation details of the embodiments of FIG. 7.

For instance, as exemplified in FIG. 8, the reference periodic signal may be superimposed to the bias voltage of the piezoresistive sensor 10, being propagated to the output signal $V_S$ thereby.

Therefore, in the circuit arrangement illustrated in FIG. 8, the reference periodic signal at frequency $f_H$ propagates not only through the AFE circuit 121, but also through the electrically conductive lines which couple the sensor 10 to the sensing circuit 12.

As a result, propagation (in terms of amplitude and/or phase) of the reference periodic signal at frequency $f_H$ may be affected not only by variations of the cut-off frequency $f_o$, but also by variations of the frequency of the low-pass filter pole due to the parasitic capacitances $C_P$ and $C_N$ combined with the piezoresistors R1, R2, R3, and R4 in the piezoresistive sensor 10.

Embodiments according to the topology illustrated in FIGS. 7 and 8, therefore, advantageously provide means for compensating phase shifts of a whole "sensor plus circuit" system, by making the reference periodic signal propagate through the entire propagation path of the effective signal $V_S$.

It will be appreciated that various additional or optional features described with reference to the embodiments of FIGS. 5 and 6 may apply also to the embodiments of FIGS. 7 and 8.

Embodiments of the present disclosure thus may facilitate reducing phase shift phenomena in AFE circuits, e.g., due to temperature variations, by using a feedback loop configured for sensing a reference periodic signal superimposed to the effective input signal and having a frequency higher than the frequency of the effective input signal, with improved performance over the prior art approaches.

Additionally, embodiments of the present disclosure may provide the possibility of implementing AFE circuits, such as 121, with an "aggressive" low-pass filter functionality (i.e., with a dominant pole frequency $f_o$ closer to the signal frequency $f_S$ if compared to prior art solutions) which may advantageously provide improved noise rejection performance.

One or more embodiments are suitable for use with continuous-time AFE circuits and rely on few additional circuits for implementing phase shift compensation, thereby resulting in a negligible increase of silicon area and power consumption if compared to non-compensated circuits.

One or more embodiments may facilitate compensating the effect of non-negligible parasitic capacitances $C_P$, $C_N$ and/or the effect of piezoresistors with PTC behavior without the need of NTC resistors being mounted on the PCB.

One or more embodiments are effective in providing phase shift compensation not only with respect to temperature variations, but also with respect to power supply variations or other variations of operating conditions.

Embodiments of the present description advantageously do not require an expensive temperature calibration process.

Without prejudice to the underlying principles, the details and embodiments may vary, even significantly, with respect to what has been described byway of example only, without departing from the extent of protection.

What is claimed is:

1. A sensing circuit comprising:
   a conditioning circuit configured to receive, at an input port, an input analog signal generated by a sensor at a first frequency, and to generate, at an output port, a conditioned analog signal;
   an analog-to-digital converter (ADC) coupled to the output port of the conditioning circuit, the ADC configured to receive the conditioned analog signal and provide, at a converter output node, a converted digital signal based on the conditioned analog signal, the converted digital signal being indicative of the input analog signal;
   a feedback circuit coupled between the output port of the conditioning circuit and a control input of the conditioning circuit, the feedback circuit comprising a bandpass filter configured to selectively detect a periodic signal at a second frequency, the second frequency being higher than the first frequency, wherein the feedback circuit is configured to act on the conditioning circuit to counter variations of the periodic signal at the second frequency; and
   a signal generator circuit configured to superimpose the periodic signal at the second frequency to the input analog signal received at the conditioning circuit.

2. The sensing circuit of claim 1, wherein the feedback circuit is coupled to the output port of the conditioning circuit via the ADC.

3. The sensing circuit of claim 1, further comprising a low-pass filter coupled to the converter output node of the ADC and having a low-pass cut-off frequency higher than the first frequency, the low-pass filter configured to filter out the periodic signal from the converted digital signal to generate an output digital signal indicative of the input analog signal.

4. The sensing circuit of claim 3, wherein the low-pass cut-off frequency is lower than the second frequency.

5. The sensing circuit of claim 3, wherein the low-pass cut-off frequency is higher than the second frequency.

6. The sensing circuit of claim 1, wherein the periodic signal is a square wave signal or a sinusoidal signal.

7. The sensing circuit of claim 1, wherein the periodic signal is a current signal.

8. The sensing circuit of claim 1, wherein the feedback circuit is configured to detect an amplitude or phase of the periodic signal at the second frequency and act on the conditioning circuit based on the detected amplitude or phase to counter variations of the periodic signal at the second frequency.

9. The sensing circuit of claim 1, wherein the signal generator circuit comprises a voltage oscillator and a voltage-to-current converter circuit configured to generate the periodic signal at the second frequency in the form of a square wave current signal.

10. The sensing circuit of claim 1, wherein the signal generator circuit is configured to superimpose the periodic signal at the second frequency to the input analog signal received at the conditioning circuit by injecting the periodic signal into a supply voltage of the sensor.

11. The sensing circuit of claim 1, wherein the conditioning circuit comprises an operational amplifier, and wherein the signal generator circuit is configured to superimpose the periodic signal at the second frequency to the input analog signal received at the conditioning circuit by injecting the periodic signal directly into an input of the operational amplifier.

12. The sensing circuit of claim 11, wherein the input analog signal is a differential signal, and wherein the periodic signal is a differential signal.

13. The sensing circuit of claim 1, wherein the signal generator circuit is configured to generate the periodic signal by applying a temperature-independent reference voltage to a resistor.

14. A micro-electro-mechanical (MEM) system comprising:
   a MEM actuator;
   a piezoresistive sensor configured to sense mechanical information of the MEM actuator and produce an input analog signal based on the mechanical information of the MEM actuator; and
   a sensing circuit comprising:
      a conditioning circuit configured to receive, at an input port, the input analog signal, and to generate, at an output port, a conditioned analog signal;
      an analog-to-digital converter (ADC) coupled to the output port of the conditioning circuit, the ADC configured to receive the conditioned analog signal and provide, at a converter output node, a converted digital signal based on the conditioned analog signal, the converted digital signal being indicative of the input analog signal;
      a signal generator circuit configured to superimpose a periodic signal to the input analog signal; and
      a feedback circuit coupled between the output port of the conditioning circuit and a control input of the conditioning circuit, wherein the feedback circuit is configured to act on the conditioning circuit to counter variations of the periodic signal.

15. The MEM system of claim 14, wherein the signal generator circuit is configured to inject the periodic signal to a supply node of the piezoresistive sensor.

16. The MEM system of claim 14, wherein the conditioning circuit comprises an operational amplifier configured to receive the analog input signal, and wherein the signal generator circuit is configured to inject the periodic signal directly to an input of the operational amplifier.

17. The MEM system of claim 14, wherein the MEM actuator is a micro-mirror and wherein the mechanical information comprises deformation or movement of the micro-mirror.

18. A method comprising:
generating, with a sensor, an input analog signal at a first frequency;
superimposing a periodic signal at a second frequency to the input analog signal to generate a combined analog signal, wherein the second frequency is higher than the first frequency;
generating, using a conditioning circuit, a conditioned analog signal based on the combined analog signal;
selectively detecting the periodic signal from the conditioned analog signal; and
acting on the conditioning circuit to counter variations of the periodic signal detected from the conditioned analog signal.

19. The method of claim 18, further comprising:
converting the conditioned analog signal to a converted digital signal; and
filtering out the periodic signal from the converted digital signal to generate an output digital signal, wherein selectively detecting the periodic signal from the conditioned analog signal comprises selectively detecting the periodic signal from the converted digital signal.

20. The method of claim 18, wherein superimposing the periodic signal to the input analog signal to generate the combined analog signal comprises injecting the periodic signal to a supply terminal of the sensor.

21. The method of claim 18, wherein superimposing the periodic signal to the input analog signal to generate the combined analog signal comprises injecting the periodic signal to an operational amplifier of the conditioning circuit.

22. The method of claim 18, further comprising generating the periodic signal by applying a temperature independent reference voltage to a resistor.

* * * * *